(12) United States Patent
Khamesra et al.

(10) Patent No.: US 8,072,834 B2
(45) Date of Patent: Dec. 6, 2011

(54) LINE DRIVER CIRCUIT AND METHOD WITH STANDBY MODE OF OPERATION

(75) Inventors: Arun Khamesra, Bangalore (IN); Badrinarayanan Kothandaraman, Banaglore (IN)

(73) Assignee: Cypress Semiconductor Corporation

( * ) Notice: Subject to any disclaimer, the term of this patent is extended or adjusted under 35 U.S.C. 154(b) by 370 days.

(21) Appl. No.: 11/510,347

(22) Filed: Aug. 25, 2006

(65) Prior Publication Data

US 2007/0140037 A1 Jun. 21, 2007

Related U.S. Application Data

(60) Provisional application No. 60/726,073, filed on Oct. 11, 2005.

(30) Foreign Application Priority Data

Aug. 25, 2005 (IN) ............................ 1174/CHE/2005

(51) Int. Cl.
*G11C 8/00* (2006.01)

(52) U.S. Cl. .................................. 365/230.06; 365/229

(58) Field of Classification Search .................. 365/226, 365/229 X, 230.06 O, 229, 230.06
See application file for complete search history.

(56) References Cited

U.S. PATENT DOCUMENTS

| | | | |
|---|---|---|---|
| 3,636,530 A | 1/1972 | Mark et al. |
| 3,676,717 A | 7/1972 | Lockwood |
| 3,811,076 A | 5/1974 | Smith, Jr. |
| 3,846,768 A | 11/1974 | Krick |
| 3,906,464 A | 9/1975 | Lattin |
| 3,942,160 A | 3/1976 | Yu |
| 3,950,737 A | 4/1976 | Uchida et al. |
| 4,000,413 A | 12/1976 | Wong et al. |
| 4,044,343 A | 8/1977 | Uchida |
| 4,051,388 A | 9/1977 | Inukai |
| 4,074,237 A | 2/1978 | Spampinato |
| 4,090,259 A | 5/1978 | Wilcock et al. |
| 4,095,281 A | 6/1978 | Denes |
| 4,096,584 A | 6/1978 | Owen, III et al. |
| 4,100,437 A | 7/1978 | Hoff, Jr. |
| 4,103,344 A | 7/1978 | Fagan et al. |

(Continued)

FOREIGN PATENT DOCUMENTS

WO 94/10686 A1 5/1994

(Continued)

OTHER PUBLICATIONS

U.S. Appl. No. 11/234,429, Chapman et al.

(Continued)

*Primary Examiner* — VanThu Nguyen

(57) ABSTRACT

A line driver circuit can include an integrated circuit substrate of a first conductivity type having at least a first and a second well of a second conductivity type formed therein. The second well can be coupled to a first power supply node. A first transistor can be formed in the first well having a source coupled to a first input signal node, a drain coupled to a conductive line, and a gate coupled to a second input signal node. A second transistor can have a source coupled to a second power supply node, a drain coupled to the conductive line, and a gate coupled to the second input signal node. A third transistor can be formed in the second well and have a source coupled to the first power supply node, a drain coupled to the first well, and a gate coupled to receive a mode signal.

16 Claims, 3 Drawing Sheets

U.S. PATENT DOCUMENTS

| | | |
|---|---|---|
| 4,110,639 A | 8/1978 | Redwine |
| 4,112,507 A | 9/1978 | White et al. |
| 4,128,773 A | 12/1978 | Troutman et al. |
| 4,132,904 A | 1/1979 | Harari |
| 4,138,737 A | 2/1979 | McCann |
| 4,143,286 A | 3/1979 | Koike |
| 4,146,802 A | 3/1979 | Moench |
| 4,149,099 A | 4/1979 | Nagami |
| 4,156,941 A | 5/1979 | Homma et al. |
| 4,158,241 A | 6/1979 | Takemae et al. |
| 4,185,321 A | 1/1980 | Iwahashi et al. |
| 4,216,395 A | 8/1980 | Beecham et al. |
| 4,262,219 A | 4/1981 | Richard |
| 4,270,188 A | 5/1981 | Saito |
| 4,271,487 A | 6/1981 | Craycraft et al. |
| 4,290,013 A | 9/1981 | Thiel |
| 4,291,242 A | 9/1981 | Schriber |
| 4,342,101 A | 7/1982 | Edwards |
| 4,347,448 A | 8/1982 | Plachno |
| 4,354,255 A | 10/1982 | Stewart |
| 4,370,798 A | 2/1983 | Lien et al. |
| 4,388,537 A | 6/1983 | Kanuma |
| 4,403,306 A | 9/1983 | Tokushige et al. |
| 4,422,161 A | 12/1983 | Kressel et al. |
| 4,433,252 A | 2/1984 | Lewis |
| 4,435,786 A | 3/1984 | Tickle |
| 4,464,590 A | 8/1984 | Rapp |
| 4,472,643 A | 9/1984 | Furuyama |
| 4,473,762 A | 9/1984 | Iwahashi et al. |
| 4,500,974 A | 2/1985 | Nagami |
| 4,510,584 A | 4/1985 | Dias et al. |
| 4,514,830 A | 4/1985 | Hagiwara et al. |
| 4,516,224 A | 5/1985 | Aoyama |
| 4,527,255 A | 7/1985 | Keshtbod |
| 4,538,246 A | 8/1985 | Wang et al. |
| 4,541,006 A | 9/1985 | Ariizumi et al. |
| 4,541,073 A | 9/1985 | Brice et al. |
| 4,546,457 A | 10/1985 | Nozaki et al. |
| 4,560,419 A | 12/1985 | Bourassa et al. |
| 4,638,465 A | 1/1987 | Rosini et al. |
| 4,651,303 A | 3/1987 | Dias et al. |
| 4,675,715 A | 6/1987 | Lepselter et al. |
| 4,679,170 A | 7/1987 | Bourassa et al. |
| 4,698,589 A | 10/1987 | Blankenship et al. |
| 4,701,858 A | 10/1987 | Stokes et al. |
| 4,703,456 A | 10/1987 | Arakawa |
| 4,716,552 A | 12/1987 | Maltiel et al. |
| 4,747,083 A | 5/1988 | Nakajima |
| 4,751,683 A | 6/1988 | Wada et al. |
| 4,758,945 A | 7/1988 | Remedi |
| 4,769,787 A | 9/1988 | Furusawa et al. |
| 4,774,203 A | 9/1988 | Ikeda et al. |
| 4,794,568 A | 12/1988 | Lim et al. |
| 4,799,194 A | 1/1989 | Arakawa |
| 4,800,533 A | 1/1989 | Arakawa |
| 4,841,286 A | 6/1989 | Kummer |
| 4,870,615 A | 9/1989 | Maroyama et al. |
| 4,878,203 A | 10/1989 | Arakawa |
| 4,901,280 A | 2/1990 | Patel |
| 4,905,197 A | 2/1990 | Urai |
| 4,935,649 A | 6/1990 | Bloker |
| 4,939,385 A | 7/1990 | Dubujet |
| 4,984,211 A | 1/1991 | Tran |
| 4,984,256 A | 1/1991 | Imai |
| 5,029,132 A | 7/1991 | Arakawa |
| 5,051,958 A | 9/1991 | Arakawa |
| 5,065,362 A | 11/1991 | Herdt et al. |
| 5,068,697 A | 11/1991 | Noda et al. |
| 5,097,449 A | 3/1992 | Cuevas |
| 5,111,257 A | 5/1992 | Andoh et al. |
| 5,121,359 A | 6/1992 | Steele |
| 5,132,936 A | 7/1992 | Keswick et al. |
| 5,146,429 A | 9/1992 | Kawai et al. |
| 5,168,334 A | 12/1992 | Mitchell et al. |
| 5,189,641 A | 2/1993 | Arakawa |
| 5,222,047 A | 6/1993 | Matsuda et al. |
| 5,241,510 A | 8/1993 | Kobayashi et al. |
| 5,255,228 A | 10/1993 | Hatta et al. |
| 5,255,234 A | 10/1993 | Seok |
| 5,262,998 A | 11/1993 | Mnich et al. |
| 5,268,863 A | 12/1993 | Bader et al. |
| 5,283,764 A | 2/1994 | Kim et al. |
| 5,287,307 A | 2/1994 | Fukuda et al. |
| 5,287,319 A | 2/1994 | Fukumoto |
| 5,293,133 A | 3/1994 | Birkner et al. |
| 5,300,832 A | 4/1994 | Rogers |
| 5,315,177 A | 5/1994 | Zagar et al. |
| 5,323,377 A | 6/1994 | Chen et al. |
| 5,325,334 A | 6/1994 | Roh et al. |
| 5,327,385 A | 7/1994 | Oyama |
| 5,329,488 A | 7/1994 | Hashimoto |
| 5,333,122 A | 7/1994 | Ninomiya |
| 5,343,432 A | 8/1994 | Matsuo et al. |
| 5,345,424 A | 9/1994 | Landgraf |
| 5,349,556 A | 9/1994 | Lee |
| 5,349,558 A | 9/1994 | Cleveland et al. |
| 5,353,248 A | 10/1994 | Gupta |
| 5,357,473 A | 10/1994 | Mizuno et al. |
| 5,362,997 A | 11/1994 | Bloker |
| 5,365,475 A | 11/1994 | Matsumura et al. |
| 5,369,619 A | 11/1994 | Ohba |
| 5,381,370 A | 1/1995 | Lacey et al. |
| 5,387,534 A | 2/1995 | Prall |
| 5,392,245 A | 2/1995 | Manning |
| 5,414,364 A | 5/1995 | McCollum |
| 5,424,569 A | 6/1995 | Prall |
| 5,426,605 A | 6/1995 | Van Berkel et al. |
| 5,434,824 A | 7/1995 | Matsuzaki |
| 5,436,480 A | 7/1995 | Yu |
| 5,438,548 A | 8/1995 | Houston |
| 5,440,508 A | 8/1995 | Pathak et al. |
| 5,467,300 A | 11/1995 | Komarek et al. |
| 5,469,390 A | 11/1995 | Sasaki et al. |
| 5,469,396 A | 11/1995 | Eltoukhy |
| 5,477,485 A | 12/1995 | Bergemont et al. |
| 5,479,374 A | 12/1995 | Kobayashi et al. |
| 5,485,429 A | 1/1996 | Ono |
| 5,488,579 A | 1/1996 | Shama et al. |
| 5,496,756 A | 3/1996 | Shama et al. |
| 5,502,395 A | 3/1996 | Allen |
| 5,506,816 A | 4/1996 | Hirose et al. |
| 5,510,638 A | 4/1996 | Lancaster et al. |
| 5,511,020 A | 4/1996 | Hu et al. |
| 5,517,448 A | 5/1996 | Liu |
| 5,523,971 A | 6/1996 | Rao |
| 5,539,334 A | 7/1996 | Clapp et al. |
| 5,539,697 A | 7/1996 | Kim et al. |
| 5,563,839 A | 10/1996 | Herdt et al. |
| 5,586,073 A | 12/1996 | Hiura et al. |
| 5,602,776 A | 2/1997 | Herdt et al. |
| 5,612,623 A | 3/1997 | Watanabe et al. |
| 5,621,696 A | 4/1997 | Dhong et al. |
| 5,635,854 A | 6/1997 | Shimanek et al. |
| 5,644,533 A | 7/1997 | Lancaster et al. |
| 5,648,930 A | 7/1997 | Randazzo |
| 5,656,837 A | 8/1997 | Lancaster et al. |
| 5,668,485 A | 9/1997 | Rountree |
| 5,673,231 A | 9/1997 | Furutani |
| 5,677,866 A | 10/1997 | Kinoshita |
| 5,694,047 A | 12/1997 | Goetting et al. |
| 5,719,812 A | 2/1998 | Seki et al. |
| 5,724,292 A | 3/1998 | Wada |
| 5,734,617 A | 3/1998 | Zheng |
| 5,748,016 A * | 5/1998 | Kurosawa ................. 326/34 |
| 5,760,644 A | 6/1998 | Lancaster et al. |
| 5,761,148 A | 6/1998 | Allan et al. |
| 5,774,397 A | 6/1998 | Endoh et al. |
| 5,774,400 A | 6/1998 | Lancaster et al. |
| 5,774,413 A | 6/1998 | Hunt |
| 5,789,776 A | 8/1998 | Lancaster et al. |
| 5,793,684 A | 8/1998 | Yach |
| 5,796,651 A | 8/1998 | Horne et al. |
| 5,799,200 A | 8/1998 | Brant et al. |
| 5,808,500 A | 9/1998 | Kalpkjian |
| 5,812,477 A | 9/1998 | Casper et al. |
| 5,821,800 A | 10/1998 | Le et al. |
| 5,825,715 A | 10/1998 | Rezeanu |

| | | |
|---|---|---|
| 5,828,599 A | 10/1998 | Herdt |
| 5,847,577 A | 12/1998 | Trimberger |
| 5,864,499 A | 1/1999 | Roohparvar et al. |
| 5,864,507 A | 1/1999 | Hawkins et al. |
| 5,875,144 A | 2/1999 | Zheng |
| 5,875,149 A | 2/1999 | Oh et al. |
| 5,889,728 A | 3/1999 | Rezeanu |
| 5,892,371 A | 4/1999 | Maley |
| 5,892,712 A | 4/1999 | Hirose et al. |
| 5,894,442 A | 4/1999 | Okamura |
| 5,896,334 A | 4/1999 | Casper et al. |
| 5,909,407 A | 6/1999 | Yamamoto et al. |
| 5,920,510 A | 7/1999 | Yukutake et al. |
| 5,936,894 A | 8/1999 | Hawkins et al. |
| 5,940,337 A | 8/1999 | Jiang |
| 5,952,833 A | 9/1999 | Morgan |
| 5,956,269 A | 9/1999 | Ouyang et al. |
| 5,978,298 A | 11/1999 | Zheng |
| 5,982,688 A | 11/1999 | Han |
| 5,986,932 A | 11/1999 | Ratnakumar et al. |
| 5,986,942 A | 11/1999 | Sugibayashi |
| 5,999,447 A | 12/1999 | Naura et al. |
| 6,011,742 A | 1/2000 | Zheng |
| 6,016,264 A | 1/2000 | Lin |
| 6,026,018 A | 2/2000 | Herdt et al. |
| 6,049,503 A | 4/2000 | Khang |
| 6,084,814 A | 7/2000 | Casper et al. |
| 6,088,289 A | 7/2000 | Landry et al. |
| 6,097,618 A | 8/2000 | Jenne |
| 6,122,191 A | 9/2000 | Hirose et al. |
| 6,125,069 A | 9/2000 | Aoki |
| 6,141,247 A | 10/2000 | Roohparvar et al. |
| 6,172,907 B1 | 1/2001 | Jenne |
| 6,181,627 B1 | 1/2001 | Casper et al. |
| 6,240,027 B1 | 5/2001 | Lee et al. |
| 6,246,627 B1 | 6/2001 | Yamauchi et al. |
| 6,285,586 B1 | 9/2001 | Lung et al. |
| 6,292,025 B1 | 9/2001 | Okumura |
| 6,297,103 B1 | 10/2001 | Ahn et al. |
| 6,333,891 B1 | 12/2001 | Landry et al. |
| 6,383,011 B2 | 5/2002 | Chen |
| 6,384,664 B1 | 5/2002 | Hellums et al. |
| 6,388,927 B1 | 5/2002 | Churchill et al. |
| 6,420,925 B1 | 7/2002 | Fifield et al. |
| 6,462,998 B1 | 10/2002 | Proebsting |
| 6,469,930 B1 | 10/2002 | Murray |
| 6,501,306 B1 | 12/2002 | Kim et al. |
| 6,519,193 B2 | 2/2003 | Nakano |
| 6,553,556 B1 | 4/2003 | Blodgett |
| 6,556,487 B1 | 4/2003 | Ratnakumar et al. |
| 6,590,420 B1 | 7/2003 | Mnich et al. |
| 6,590,819 B1 | 7/2003 | Baum et al. |
| 6,603,701 B2 | 8/2003 | Mizugaki et al. |
| 6,608,498 B2 | 8/2003 | Khoury |
| 6,614,070 B1 | 9/2003 | Hirose et al. |
| 6,617,914 B1 | 9/2003 | Kothandaraman |
| 6,621,324 B2 | 9/2003 | Fifield et al. |
| 6,625,080 B2 | 9/2003 | Casper et al. |
| 6,633,508 B2 | 10/2003 | Casper et al. |
| 6,646,934 B2 | 11/2003 | Sakata |
| 6,654,309 B1 | 11/2003 | Hirose |
| 6,741,098 B2 * | 5/2004 | Takahashi et al. ............... 326/81 |
| 6,741,117 B2 | 5/2004 | Lee |
| 6,744,663 B2 | 6/2004 | Garni et al. |
| 6,759,895 B2 | 7/2004 | Takemi |
| 6,781,916 B2 | 8/2004 | McClure |
| 6,801,064 B1 | 10/2004 | Hunt et al. |
| 6,850,454 B2 | 2/2005 | Kuge et al. |
| 6,983,404 B2 | 1/2006 | Cutter et al. |
| 6,999,373 B2 | 2/2006 | Abedifard |
| 7,042,245 B2 * | 5/2006 | Hidaka ........................... 326/34 |
| 7,046,074 B2 * | 5/2006 | Jang ............................... 327/534 |
| 7,079,443 B2 * | 7/2006 | Takita et al. ............. 365/230.06 |
| 7,095,642 B1 | 8/2006 | Parent et al. |
| 7,146,585 B2 | 12/2006 | Blodgett |
| 7,149,114 B2 | 12/2006 | Taheri et al. |
| 7,342,836 B2 | 3/2008 | Taheri et al. |

FOREIGN PATENT DOCUMENTS

| | | |
|---|---|---|
| WO | 95/30244 A1 | 11/1995 |
| WO | 97/15929 A1 | 5/1997 |

OTHER PUBLICATIONS

USPTO Notice of Allowance for U.S. Appl. No. 08/111,164 dated Jul. 12, 1994; 3 pages.

USPTO Non-Final Rejection for U.S. Appl. No. 08/111,164 dated Mar. 23, 1994; 3 pages.

USPTO Notice of Allowance for U.S. Appl. No. 08/692,571 dated Jul. 2, 1997; 2 pages.

USPTO Notice of Allowance for U.S. Appl. No. 08/413,360 dated Mar. 26, 1996; 2 pages.

USPTO Non-Final Rejection for U.S. Appl. No. 08/413,360 dated Nov. 6, 1995; 4 pages.

USPTO Notice of Allowance for U.S. Appl. No. 07/361,033 dated Apr. 30, 1991; 3 pages.

USPTO Final Rejection for U.S. Appl. No. 07/361,033 dated Jan. 18, 1991; 5 pages.

USPTO Non-Final Rejection for U.S. Appl. No. 07/361,033 dated Jun. 12, 1990; pages.

USPTO Notice of Allowance for U.S. Appl. No. 08/764,329 dated Dec. 24, 1997; 1 page.

USPTO Non-Final Rejection for U.S. Appl. No. 08/764,329 dated Jul. 30, 1997; 8 pages.

USPTO Notice of Allowance for U.S. Appl. No. 08/769,241 dated Dec. 24, 1997; 1 page.

USPTO Non-Final Rejection for U.S. Appl. No. 08/769,241 dated Aug. 28, 1997; 3 pages.

USPTO Notice of Allowance for U.S. Appl. No. 09/405,950 dated Mar. 13, 2000; 3 pages.

USPTO Notice of Allowance for U.S. Appl. No. 09/613,949 dated Jun. 1, 2001; 1 page.

USPTO Non-Final Rejection for U.S. Appl. No. 09/613,949 dated Feb. 23, 2001; 5 pages.

USPTO Notice of Allowance for U.S. Appl. No. 09/094,786 dated Feb. 11, 1999; 4 pages.

USPTO Final Rejection for U.S. Appl. No. 09/094,786 dated Dec. 16, 1998; 5 pages.

USPTO Non-Final Rejection for U.S. Appl. No. 09/094,786 dated Sep. 3, 1998; 6 pages.

USPTO Notice of Allowance for U.S. Appl. No. 10/029,371 dated Jun. 17, 2003; 5 pages.

USPTO Non-Final Rejection for U.S. Appl. No. 10/029,371 dated Dec. 13, 2002; 8 pages.

USPTO Notice of Allowance for U.S. Appl. No. 10/029,370 dated Feb. 25, 2003; 5 pages.

USPTO Notice of Allowance for U.S. Appl. No. 10/029,370 dated Oct. 17, 2002; 7 pages.

USPTO Notice of Allowance for U.S. Appl. No. 09/021,681 dated Oct. 1, 1998; 3 pages.

USPTO Non-Final Rejection for U.S. Appl. No. 07/991,568 dated Oct. 5, 1993; 5 pages.

USPTO Notice of Allowance for U.S. Appl. No. 07/991,568 dated May 20, 1994; 1 page.

USPTO Final Rejection for U.S. Appl. No. 07/991,568 dated Feb. 1, 1994; 5 pages.

USPTO Non-Final Rejection for U.S. Appl. No. 07/217,682 dated Jan. 4, 1989; 3 pages.

USPTO Non-Final Rejection for U.S. Appl. No. 07/217,682 dated Jul. 31, 1989; 3 pages.

USPTO Notice of Allowance for U.S. Appl. No. 07/217,682 dated Dec. 5, 1989; 1 page.

USPTO Notice of Allowance for U.S. Appl. No. 10/228,436 dated Mar. 18, 2004; 6 pages.

USPTO Non-Final Rejection for U.S. Appl. No. 10/228,436 dated Nov. 13, 2003; 6 pages.

USPTO Advisory Action for U.S. Appl. No. 10/228,436 dated Oct. 8, 2003; 3 pages.

USPTO Final Rejection for U.S. Appl. No. 10/228,436 dated Jul. 16, 2003; 8 pages.

USPTO Non-Final Rejection for U.S. Appl. No. 10/228,436 dated Mar. 27, 2003; 9 pages.
USPTO Notice of Allowance for U.S. Appl. No. 10/799,742 dated Mar. 24, 2006; 4 pages.
USPTO Non-Final Rejection for U.S. Appl. No. 10/799,742 dated May 10, 2005; 7 pages.
USPTO Advisory Action for U.S. Appl. No. 10/799,742 dated Jan. 30, 2006; 3 pages.
USPTO Final Rejection for U.S. Appl. No. 10/799,742 dated Oct. 31, 2005; 7 pages.
USPTO Notice of Allowance for U.S. Appl. No. 09/792,102 dated Feb. 11, 2002; 5 pages.
USPTO Non-Final Rejection for U.S. Appl. No. 09/792,102 dated Sep. 4, 2001; 9 pages.
USPTO Notice of Allowance for U.S. Appl. No. 08/766,090 dated Nov. 19, 1997; 2 pages.
USPTO Non-Final Rejection for U.S. Appl. No. 08/766,090 dated Jul. 8, 1997; 7 pages.
USPTO Non-Final Rejection for U.S. Appl. No. 11/234,429 dated Jun. 18, 2007; 7 pages.
USPTO Notice of Allowance for U.S. Appl. No. 11/234,429 dated Oct. 18, 2007; 5 pages.
USPTO Notice of Allowance for U.S. Appl. No. 10/803,011 dated Aug. 3, 2006; 7 pages.
USPTO Final Rejection for U.S. Appl. No. 10/803,011 dated May 30, 2006; 13 pages.
USPTO Non-Final Rejection for U.S. Appl. No. 10/803,011 dated 1Dec. 9, 2005; 13 pages.
Ohnakado et al."Novel Electron Injection Method Using Band-to-Band Tunneling Induced Hot Electron (BBHE) for Flash Memory with a P-Channel Cell", IEDM 95-279, pp. 11.5-11.5.4 (1995); 4 pages.
Herdt et al."A 256K Nonvolative Static RAM", Simtek Corporation, No. 5.3, pp. 1-4 (1995); 4 pages.
USPTO Notice of Allowance for U.S. Appl. No. 08/735,973 dated Nov. 21, 1997; 3 pages.
USPTO Notice of Allowance for U.S. Appl. No. 08/885,156 dated Dec. 16, 1998; 1 pages.
USPTO Non-Final Rejection for U.S. Appl. No. 08/885,156 dated Aug. 27, 1998; 3 pages.
USPTO Notice of Allowance for U.S. Appl. No. 09/871,172 dated Dec. 13, 2002; 4 pages.
USPTO Non-Final Rejection for U.S. Appl. No. 09/871,172 dated Jul. 22, 2002; 6 pages.
USPTO Notice of Allowance for U.S. Appl. No. 09/426,100 dated Jul. 19, 2000; 4 pages.
Uspto Non-Final Rejection for U.S. Appl. No. 09/426,100 dated Mar. 10, 2000; 7 pages.
USPTO Notice of Allowance for U.S. Appl. No. 09/703,151 dated Jun. 4, 2002; 5 pages.
USPTO Non-Final Rejection for U.S. Appl. No. 09/703,151 dated Jan. 16, 2002; 5 pages.
USPTO Notice of Allowance for U.S. Appl. No. 09/136,694 dated Apr. 24, 2000; 4 pages.
USPTO Non-Final Restriction for U.S. Appl. No. 09/136,694 dated Nov. 12, 1999; 8 pages.
USPTO Restriction Requirement for U.S. Appl. No. 09/136,694 dated Aug. 17, 1999; 4 pages.
Frohman-Bentchkowsky, "The metal-Nitride-Oxide-Silicon (MNOS) Transistor Characteristics and Applications", Proc. of IEEE, vol. 58, No. 8, Aug. 1970; 13 pages.
Donaldson, et al., "SONOS 1K X 8 Static Nonvolatile RAM," IEEE Journal of Solid-State Circuits, vol. SX-17, No. 5, Oct. 1982; 5 pages.
USPTO Notice of Allowance for U.S. Appl. No. 08/772,970 dated Oct. 15, 1997; 2 pages.
USPTO Non-Final Rejection for U.S. Appl. No. 08/772,970 dated Jun. 11, 1997; 4 pages.
USPTO Notice of Allowance for U.S. Appl. No. 08/715,569 dated Aug. 19, 1997; 1 pages.
USPTO Notice of Allowance for U.S. Appl. No. 09/137,914 dated Oct. 29, 1999; 1 pages.
USPTO Non-Final Rejection for U.S. Appl. No. 09/137,914 dated Jun. 9, 1999; 4 pages.
USPTO Notice of Allowance for U.S. Appl. No. 08/549,483 dated Aug. 8, 1996; 3 pages.
USPTO Non-Final Rejection for U.S. Appl. No. 08/549,483 dated May 29, 1996; 5 pages.
USPTO Notice of Allowance for U.S. Appl. No. 08/846,558 dated Jul. 20, 1998; 8 pages.
USPTO Notice of Allowance for U.S. Appl. No. 08/234,288 dated Oct. 2, 1995; 1 pages.
USPTO Final Rejection for U.S. Appl. No. 08/234,288 dated May 31, 1995; 3 pages.
USPTO Non-Final Rejection for U.S. Appl. No. 08/234,288 dated Oct. 6, 1994; 2 pages.
Christer Svensson et al., Trap-assisted Charge Injection in MNOS Structures, Oct. 1973, J. Appl. Phys., vol. 44, No. 10; pages.
K. Ingemark Lundstrom et al. "Properties of MNOS Structures," Jun. 1972, IEEE Transactions on Electron Devices, vol. Ed-19, No. 6; pages.
Yoshihiro Takahashi et al., "Estimation of Insulation Layer Conductrance in Mnos Structure," Nov. 1993, IEEE Transactions on Electron Devices, vol. 40, No. 11; pages.
USPTO Notice of Allowance for U.S. Appl. No. 07/675,021 dated Nov. 5, 1991; 2 pages.
USPTO Non-Final Rejection for U.S. Appl. No. 07/675,021 dated Jul. 2, 1991; 5 pages.
USPTO Notice of Allowance for U.S. Appl. No. 08/988,942 dated Jan. 3, 2000; 2 pages.
USPTO Non-Final Rejection for U.S. Appl. No. 08/988,942 dated Oct. 15, 1999; 5 pages.
USPTO Non-Final Rejection for U.S. Appl. No. 08/988,942 dated Apr. 29, 1999; 4 pages.
USPTO Requirement for Restriction/Election for U.S. Appl. No. 08/988,942 dated Feb. 8, 1999; 3 pages.
UAPTO Non-Final Rejection for U.S. Appl. No. 08/926,611 dated Jul. 7, 1998; 5 pages.
USPTO Notice of Allowance for U.S. Appl. No. 08/926,611 dated Dec. 14, 1998; 3 pages.
Herdt et al., "A 256K Nonvolatile Static RAM," Simtek Corporation, No. 5.3, 1995, pp. 1-4; 4 pages.
Ohnakado et al., "Novel Electron Injection Method Using Band-to-Band Tunneling Induced Hot Electron (BBHE) for Flash Memory with a P-Channel Cell," IEDM 95-279, 1995, pp. 11.5.1-11.5.4; 4 pages.
Betty Prince, "Semiconductor Memories: A Handbook of Design, Manufacture and Application," Second Edition, Texas Instruments, John Wiley & Sons, 1983, pp. 611-620; 11 pages.
USPTO Notice of Allowance for U.S. Appl. No. 09/613,874 dated Nov. 19, 2002; 7 pages.
USPTO Non-Final Rejection for U.S. Appl. No. 09/613,874 dated May 28, 2002; 6 pages.
USPTO Non-Final Rejection for U.S. Appl. No. 09/613,874 dated Dec. 28, 2001; 5 pages.
USPTO Restriction Requirement for U.S. Appl. No. 09/613,874 dated Aug. 14, 2001; 4 pages.
USPTO Notice of Allowance for U.S. Appl. No. 08/672,757 dated Jan. 6, 1998; 5 pages.
USPTO Non-Final Rejection for U.S. Appl. No. 08/672,757 dated Sep. 3, 1997; 7 pages.
USPTO Notice of Allowance for U.S. Appl. No. 08/427,826 dated Oct. 21, 1996; 4 pages.
USPTO Notice of Allowance for U.S. Appl. No. 08/427,826 dated Oct. 16, 1996; 8 pages.
USPTO Notice of Allowance for U.S. Appl. No. 08/633,857 dated Feb. 18, 1997; 3 pages.
USPTO Notice of Allowance for U.S. Appl. No. 08/855,040 dated Apr. 14, 1998; 5 pages.
USPTO Non-Final Rejection for U.S. Appl. No. 08/855,040 dated Nov. 17, 1997; 5 pages.

* cited by examiner

US 8,072,834 B2

LINE DRIVER CIRCUIT AND METHOD WITH STANDBY MODE OF OPERATION

This application claims the benefit of U.S. provisional patent application Ser. No. 60/726,073, filed Oct. 11, 2005, the contents of which are incorporated by reference herein, and the benefit of India Non-Provisional patent application serial number 1174/CHE/2005, filed Aug. 25, 2005.

TECHNICAL FIELD

The present invention relates generally to memory circuits, and in particular to line drivers in memory circuits.

BACKGROUND OF THE INVENTION

Integrated circuits can include line driver circuits that can drive signals across relatively long conductive lines. For example, memory circuits can include word lines, each connected to a row of memory cells that can be driven between select and de-select states. Higher density memory circuits can partition word lines to reduce overall word line size, and thus drive such word lines faster. In such architectures, word lines can include global word lines (GWLs) each of which can activate a number of sub word lines (SWLs).

Conventional SWL drivers can suffer from gate induced drain leakage (GIDL) when implemented in sub micron technologies. Such SWL gate induced drain leakage can be as much as 8 to 10% of the chip standby current ($I_{SB}$).

To better understand various features of the disclosed embodiments, a conventional SWL driver will now be described with reference to FIG. 7. FIG. 7 shows a conventional SWL driver 700 that includes a PMOS device P70, and n-channel MOS (NMOS) devices N70 and N72. Device P70 has a source that receives a block select signal BLK, a drain connected to SWL 702, and a gate connected to a global word line select signal GWLB. Device N70 has a source connected to a low power supply GND, a drain connected to SWL 702, and a gate also connected to signal GWLB. Device N72 can have a drain connected to SWL 702, a source connected to low power supply GND, and a gate connected to receive a signal BLKB that is the inverse of signal BLK.

Conventional SWL driver 700 can be placed in a standby mode by driving signal BLK low, signal BLKB high, while signal GWLB can be high. In such a state, significant current leakage (shown by arrows "Ilk") can occur through an n-well containing device P70, because a source and drain of device P70 can be at a ground potential, while the gate of the device is at a higher potential. Such leakage has GIDL as the dominant component if |Vgd| or |Vgs|=Vpwr (magnitude of gate-to-drain or gate-to-source voltage is higher or equals to supply voltage Vpwr) for any OFF transistor in standby mode. Gate induced drain leakage is not a function of gate length, and can vary exponentially with |Vgd| or |Vgs| for an off transistor.

A first conventional approach to addressing GIDL can be to reduce a gate potential applied at the affected device (e.g., PMOS P70). However, such an approach can require additional power control and regulation circuitry, and thus increases die (i.e., integrated circuit) area and design complexity. A second conventional solution can be to reduce the number of SWL drivers by increasing the number of memory cells driven by a given SWL. This can have the disadvantage of reduced speed due to increased loading. A third conventional solution can be to reduce the potential at the n-well containing the affected PMOS device, to some constant lower voltage or to ground (zero volts). Disadvantages of such an approach can also be an additional regulator circuit, resulting in increased die area and design complexity. Still further, driving an n-well to a zero volt potential can cause an increase in standby currents as a parasitic npn transistor can be formed with nearby n-wells.

DETAILED DESCRIPTION

Various embodiments of the present invention will now be described with reference to a number of figures. The embodiments shown line driver circuits, including word line driver circuits that can reduce gate induced drain leakage (GIDL) as compared to conventional approaches like those noted above.

Figure 1:
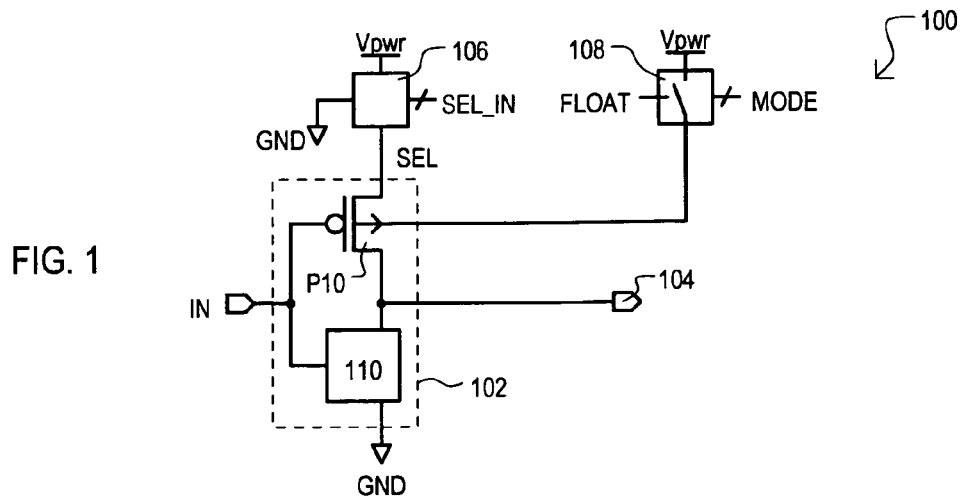
FIG. 1 is a block schematic diagram of a first embodiment.

Referring now to FIG. 1, a line driver circuit according to a first embodiment of the present invention is shown in a block schematic diagram and designated by the general reference character 100. Line driver circuit 100 can include a driver section 102, a conductive line 104, a select section 106, and a leakage control section 108.

A driver section 102 can drive conducive line 104 between a first voltage level Vpwr and a second voltage level GND based on input signal IN and a select signal SEL received from select section 106. In the particular example shown, driver section 102 can include a p-channel insulated gate field effect transistor (IGFET) P10 and a pull-down section 110. Transistor P10 can have a source connected to receive select signal SEL, a gate connected to receive the input signal IN, and a drain connected to conductive line 104. Pull-down section 110 can connect conductive line 104 to a voltage level GND when an input signal IN is high. In such an arrangement, when input signal IN is high, conductive line 104 can be driven low (e.g., GND). When input signal IN is low, and select signal SEL is high (i.e., at Vpwr), conductive line 104 can be driven high.

A select section 106 can generate a select signal SEL signal that varies between Vpwr and GND according to input select signals SEL_IN. As will be described at a later point herein, a select section 106 can include various logic or other circuits for generating select signal SEL.

Unlike conventional approaches like those described above, a leakage control section 108 can control the body (i.e., bulk portion) of device P10. In particular, according to a mode signal MODE, leakage control section 108 can either connect a body of device P10 to a high power supply voltage Vpwr, or electrically isolate the body, allowing it to "float".

Accordingly, in a low power mode, a body of PMOS device P10 can be allowed to float, as opposed to being maintained at any particular potential, such as a high power supply level Vpwr, some intermediate voltage, or even ground. In such an arrangement, the potential difference between gate and drain, and gate and source giving rise to GIDL can be reduced, if not essentially eliminated. In addition, in the event a parasitic npn transistor is formed that includes body of device P10, resulting leakage current can cause the body of device P10 to rise, eventually stopping such leakage.

In an active mode, a body of device P10 can be driven to high supply voltage Vpwr, thus enabling a fast pull-up operation of conductive line 104.

In this way, GIDL type leakage can be reduced for a line driver circuit having a low power mode (e.g., standby mode).

Figure 2:
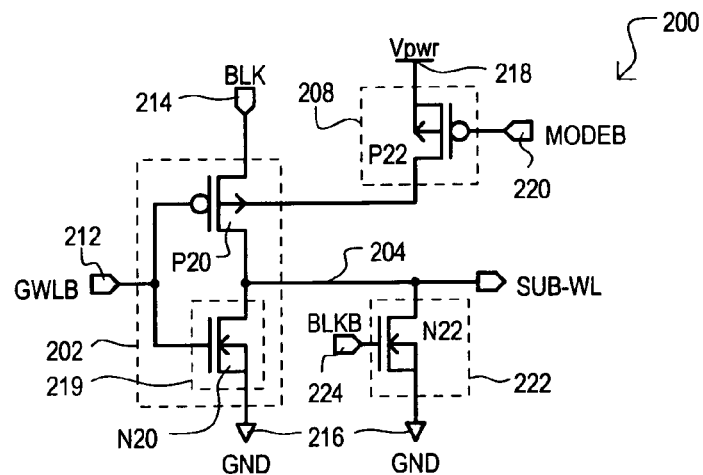
FIG. 2 is a schematic diagram of a second embodiment.

Referring now to FIG. 2, a line driver circuit according to a second embodiment is shown in a block diagram and designated by the general reference character 200. Line driver circuit 200 can include similar items to the line driver circuit 100 of FIG. 1, thus like sections are referred to by the same reference character but with the first digit being a "2" instead of a "1".

A line driver circuit 200 can be a sub word line (SWL) driver circuit, thus a conductive line 204 can be a SWL and a driver section 202 can receive a global word line signal GWLB at an input signal node 212. In addition, a select signal can be a block select signal BLK, received at a select node 214.

In the particular example of FIG. 2, a pull-down section 219 can include an n-channel IGFET N20 having a drain connected to SWL 204, a source connected to a low power supply node 216, and a gate connected to input signal node 212. Thus, when signal GWLB is active (low, in this example), transistor N20 can provide a high impedance source-drain path between low power supply node 216 and SWL 204. Conversely, when signal GWLB is inactive (high, in this example), transistor N20 can provide a low impedance source-drain path between low power supply node 216 and SWL 204.

Further, in FIG. 2 a leakage control section 208 can include a p-channel IGFET P22 having a source and body connected to a high power supply node 218, a drain connected to the body of transistor P20, and a gate connected to a mode signal node 220. In such an arrangement, in an active mode (i.e., signal MODEB low), transistor P22 can connect the body (i.e., bulk) of transistor P20 to a high power supply node 218. However, in a standby mode (i.e., signal MODEB high), a source-drain path of transistor P22 can have a high impedance, thus allowing a body of transistor P20 to be electrically isolated (i.e., float).

A SWL driver circuit 200 can also include a disable section 222. A disable section 222 can place SWL in a de-select state (low, in this case), in response to block select signal BLK. In the example shown, a disable section 222 can include an n-channel IGFET N22 having a source connected to low power supply node 216, a drain connected to SWL 204, and a gate connected to a second select signal node 224. Second select signal node 224 can receive a block select signal BLKB that is the inverse of block select signal BLK.

Figure 3:
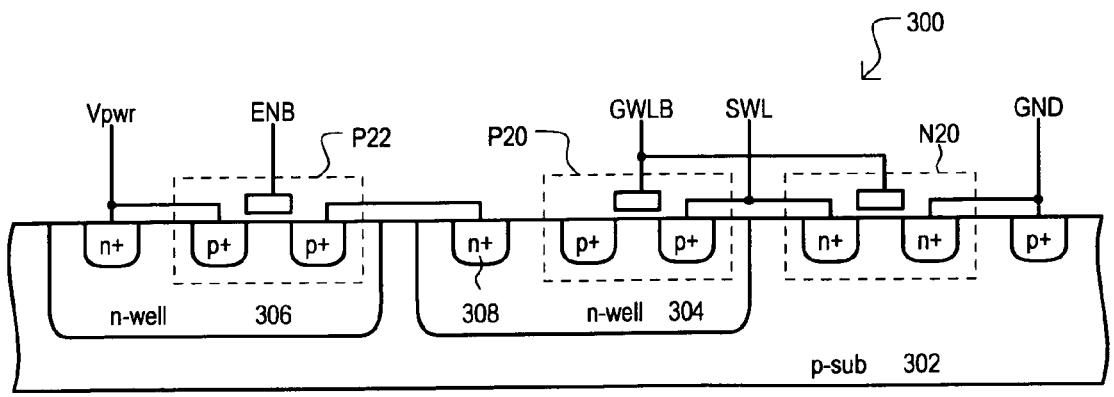
FIG. 3 is a side cross sectional view illustrating portions of the embodiment of FIG. 2.

Referring now to FIG. 3, one example of an implementation of a portion of SWL circuit 200 is shown in a side cross sectional view, and designated by the general reference character 300. SWL circuit portion 300 shows an example of transistors P20, P22 and N20. In particular, FIG. 3 shows a p-type substrate 302 that includes a first n-well 304 and a second n-well 306. First n-well 304 can contain and form the bulk or body of transistor P20. Similarly, second n-well 306 can contain and form the bulk or body of transistor P22. As shown, a well contact 308 of first n-well 304 can be connected to a drain of transistor P22 rather than a power supply voltage Vpwr. This can enable first n-well 304 to be placed into a floating state in a standby mode.

Figure 4:
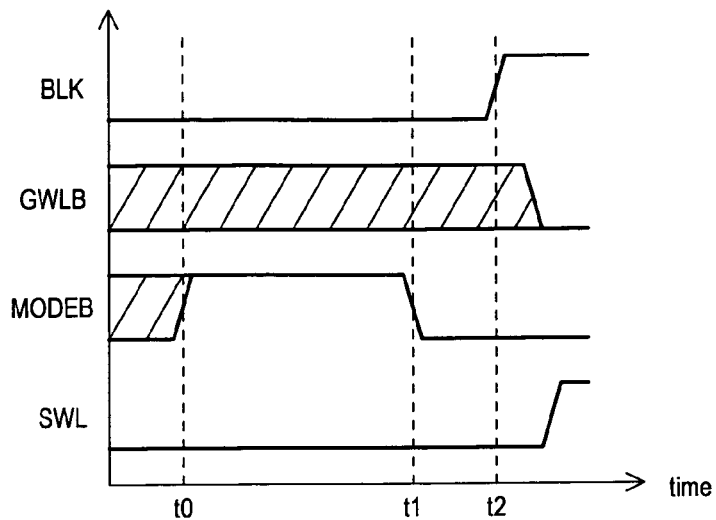
FIG. 4 is a timing diagram showing the operation of the embodiment of FIG. 2.

Having described the general construction of a SWL driver circuit 200, the operation of such a circuit will now be described in conjunction with FIG. 4. FIG. 4 is a timing diagram showing signals BLK, GWLB, MODEB and SWL of FIG. 2.

Referring now to FIG. 2 in conjunction with FIG. 4, prior to a time t0, a select signal BLK can be low. As a result, signal BLKB can be high, and transistor N22 can be turned on, pulling SWL 204 to a low power supply voltage GND.

At time t0, a device containing SWL driver circuit 200 can be placed in a standby mode. As a result, signal MODEB can transition high. With signal MODEB high, transistor P22 can be turned off, electrically isolating the body of transistor P20. As noted above, this can greatly reduce or eliminate GIDL by eliminating the cause of such leakage (body at a high voltage), and address npn parasitic leakage. Consequently, a resulting standby current (Isb) for the device can be reduced.

At time t1, a device containing SWL driver circuit 200 can be placed in an active mode. As a result, signal MODEB can transition low. With signal MODEB low, transistor P22 can be turned on, electrically connecting the body of transistor P20 to a high power supply voltage Vpwr.

At time t2, SWL 204 can be selected. Thus, a block select signal BLK can transition high. In addition, global word line signal GWLB can transition low. As a result, transistors N20 and N22 can be turned off. At the same time, transistor P20 can be turned on, connecting SWL 204 to a high power supply voltage Vpwr.

In this way, a SWL driver circuit 200 can be switched between an active mode and a reduced current standby mode.

Figure 5:
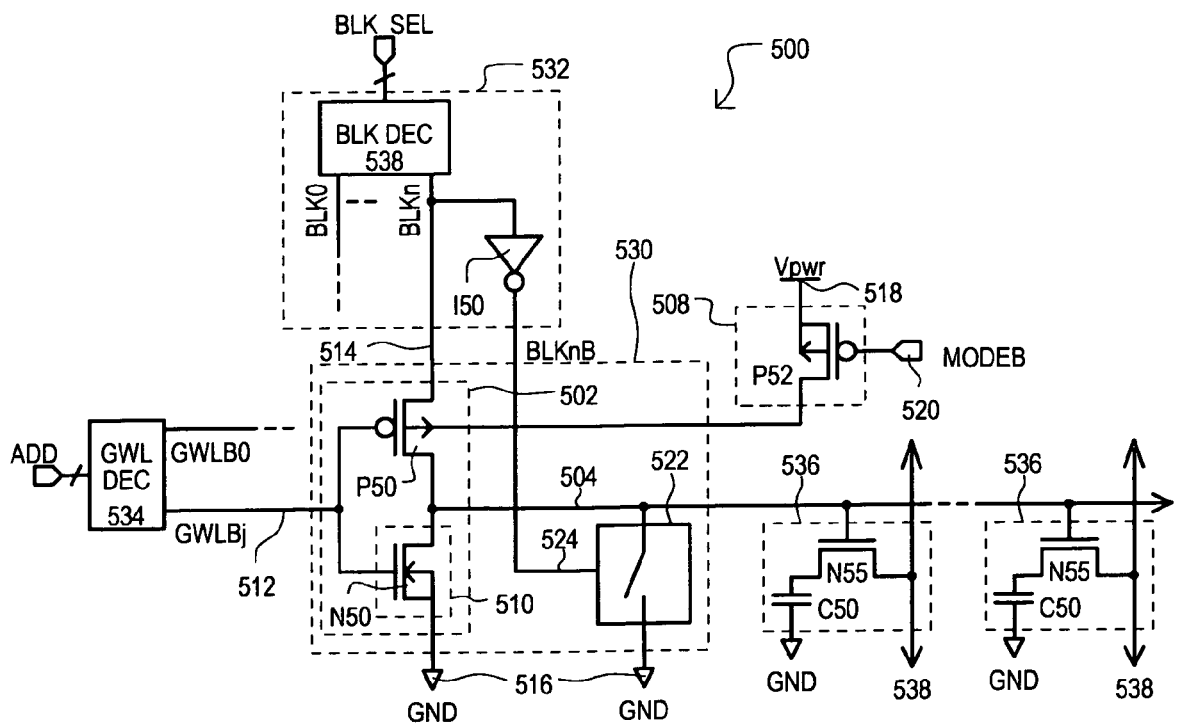
FIG. 5 is a block schematic diagram of a third embodiment.

Referring now to FIG. 5, a SWL driver arrangement according to a third embodiment is shown in a block diagram and designated by the general reference character 500. SWL driver arrangement 500 can include a SWL driver circuit 530 that can include similar items to the line driver circuits of FIGS. 1 and 2, thus like sections are referred to by the same reference character but with the first digit being a "5" instead of a "1" or a "2".

The arrangement of FIG. 5 also includes a block decoder circuit 532, global word line decoder 534, and memory cells 536. A block decoder circuit 532 can receive block select signals BLK_SEL, and include a decoder 538 that decodes such signals to activate one or more block select signals BLK0 to BLKn. Such block select signals (BLK0 to BLKn) can be inverted to generate inverted block select signals. One inverter for executing such a function is shown as 150 in FIG. 5.

A global word line decoder 534 can receive address signals ADD, and decode such signals to activate global word line signals GWLB0 to GWLBj.

Memory cells 536 can be connected to SWL 504. In the particular example of FIG. 5, memory cells 536 can be dynamic random access memory (DRAM) cells that each includes a pass transistor N55 and a storage capacitor C50. As is well understood, when SWL 504 is selected (driven high in this case), each pass transistor N55 can connect its corresponding storage capacitor to a bit line 538.

In this way, a SWL driver circuit having a low standby current mode can be included in a memory device, such as a memory device containing DRAM cells, even more particularly a pseudo-static RAM (PSRAM), or very low power SRAM.

It is noted that body (e.g., well) control of driver devices can occur on a group basis. One very particular example of such a case is shown in FIG. 6 and designated by the general reference character 600.

Figure 6:
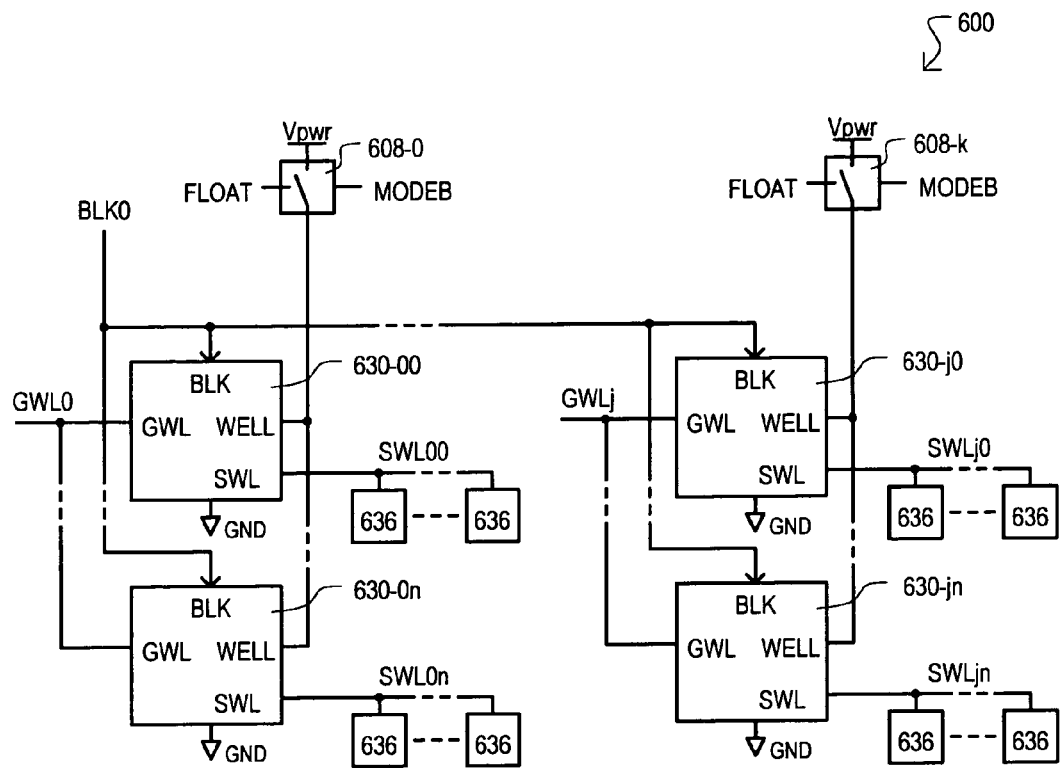
FIG. 6 is a block schematic diagram of a fourth embodiment.
Figure 7:
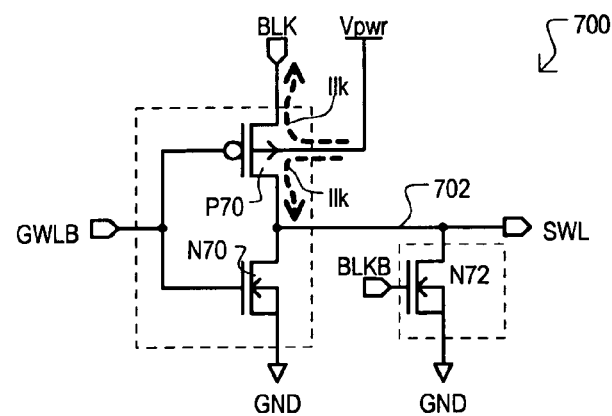
FIG. 7 is a schematic diagram of a conventional sub word line driver.

FIG. 6 shows a global word line arrangement that includes multiple SWL drivers 630-00 to 630-jn, that each drive a corresponding sub word line SWL00 to SWLjn, respectively, as well as leakage control sections 608-0 to 608-k.

Each SWL driver (630-00 to 630-jn) can have the form of SWL driver of FIG. 1, 2 or 5. For each such SWL driver (630-00 to 630-jn) input "BLK" can receive a select/block select signal, input "GWL" can receive an input signal such as a GWL signal, input WELL can be connected to a body of a driver transistor, such as the body of a p-channel IGFET, and output "SWL" can be connected to the corresponding SWL.

In the example of FIG. 6, multiple SWL drivers (630-00 to 630-jn) can receive a same global word line signal as an input. For example, SWL drivers 630-00 and 630-0n can receive global word line signal GWL0, while SWL drivers 630-j0 and 630-jn can receive global word line signal GWLj.

In the particular example of FIG. 6, all SWL drivers (630-00 to 630-jn) shown can belong to a same block, and thus can receive a same block select signal BLK0.

Leakage control sections (608-0 to 608-k) can control the bodies of driver transistors within multiple SWL drivers (630-00 to 630-jn). For example, p-channel IGFETs within multiple drivers can share a common well. Such a common well can be electrically isolated or connected to a high power supply voltage by a corresponding leakage control section.

In this way, multiple SWL drivers can share a same leakage control section.

The various embodiments can address GIDL leakage with substantially smaller area impact as compared to conventional approaches. In particular, for embodiments like that of FIGS. 2 and 5, reductions of GIDL leakage can be achieved with the addition of but one transistor with an enable signal for a whole block of SWL driver circuits.

Furthermore, the embodiments of FIGS. 2 and 5 are believed to provide the described reductions in GIDL without significantly increasing the risk of latchup in the device. In the case of p-channel driver embodiments, an n-well containing such p-channel devices can be left floating without necessarily including an extra surrounding p-tap guard-ring. With an n-well floating, there is no current path to ground, and thus little if any increase susceptibility to latchup.

According to the embodiments, when a circuit is in an active mode, there is essentially no change in the normal functionality and speed of the circuit. In the case of p-channel IGFET devices, in an active mode, the n-well containing such a device can be pulled up to a high power supply level before a select signal (e.g., BLK or SEL) is activated. Thus, in a SWL driving operation, when such a driver p-channel IGFET is turned on, the n-well for such a device will already have been charged to high voltage (e.g., vpwr), thus adding no additional increase in access time, as compared to a conventional circuit.

It is also understood that embodiments of the present invention can be well suited to performing various other steps or variations of the steps recited herein, and in a sequence other than that depicted and/or described herein.

For purposes of clarity, many of the details of the improved solution and the methods of designing and manufacturing the same that are widely known and are not relevant to the present invention have been omitted from the following description.

It is also understood that other embodiments of this invention may be practiced in the absence of an element/step not specifically disclosed herein.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A driver circuit arrangement, comprising:
   at least one driver circuit, comprising
   a first transistor of a first conductivity type having a source coupled to receive a first signal driven between a first potential and a second potential, and including a bulk portion containing the source and a drain of the first transistor;
   a second transistor of a second conductivity type having a drain coupled to the drain of the first transistor and a source coupled to a first power supply node that is coupled to receive the first potential;
   a third transistor of the second conductivity type having a drain coupled to the drain of the first transistor and a source coupled to the first power supply node; and
   a control device comprising a fourth transistor of the first conductivity type having a source coupled to a second power supply node and a drain coupled to the bulk portion of the first transistor, the control device configured to connect the bulk portion of the first transistor to the second power supply in an active mode of operation, and in a standby mode of operation to allow the bulk portion of the first transistor to electrically float and thereby electrically isolate the bulk portion of the first transistor from any direct voltage source.

2. The driver circuit arrangement of claim 1, wherein:
   the first transistor comprises a p-channel insulated gate field effect transistor (IGFET); and
   the second and third transistors comprise n-channel IGFETs.

3. The driver circuit arrangement of claim 1, wherein:
   the driver circuit arrangement comprises at least one other driver circuit comprising at least one other first transistor; and
   the control device allows bulk portions of the first transistor and the at least one other first transistor to electrically float in the second mode of operation.

4. The driver circuit arrangement of claim 1, the fourth transistor having a drain coupled to the bulk of the first transistor and a gate coupled to receive a mode signal.

5. The driver circuit arrangement of claim 4, wherein:
   the mode signal is driven to the second potential in the first mode of operation and to the first potential in a second mode of operation.

6. The driver circuit arrangement of claim 1, wherein:
the second transistor includes a gate coupled to receive a second signal that is the inverse of the first signal.

7. The driver circuit arrangement of claim 1, wherein:
the at least a one driver circuit further includes
a word line coupled to the drain of the first transistor, and
a plurality of memory cells coupled to the word line.

8. The driver circuit arrangement of claim 1, wherein:
the at least one driver circuit comprises:
a sub-word line coupled the drain of the first transistor, one or more memory cells coupled to the sub-word line; and
a global word line coupled to the gates of the first and second transistors.

9. The driver circuit arrangement of claim 8, further including:
a global word line decoder circuit that activates one of a plurality of global word line signals in response to different combinations of address input signals;
the global word line being coupled to receive one of the global word line signals; and
a block decoder circuit that activates the first signal in response to particular combinations of block select signals.

10. A line driver circuit, comprising:
an integrated circuit substrate of a first conductivity type having at least a first well and a second well of a second conductivity type formed therein, the second well being coupled to a first power supply node;
a first transistor formed in the first well having a source coupled to a first input signal node, a drain coupled to a conductive line, and a gate coupled to a second input signal node;
a second transistor having a source coupled to a second power supply node, a drain coupled to the conductive line, and a gate coupled to the second input signal node;
a third transistor formed in the second well having a source coupled to the first power supply node, a drain coupled to the first well, and a gate coupled to a mode signal node, the third transistor couples the first well to the first power supply node during an active mode of operation of the line driver circuit in response to the mode signal having a first value and allows the first well to electrically float thereby electrically isolating the first well during a standby mode of operation of the line driver circuit in response to the mode signal having a second value.

11. The line driver circuit of claim 10, wherein:
the substrate is a p-type substrate and the first and second wells are n-type wells; and
the first transistor and third transistor are p-channel insulated gate field effect transistors (IGFETs), and the second transistor is an n-channel IGFET.

12. The line driver circuit of claim 10, further including:
a fourth transistor having a source coupled to the second power supply node, a drain coupled to the conductive line, and a gate coupled to a third input signal node; wherein
the first input signal node receives a first input signal and the third input signal node receives a third input signal that is the inverse of the first input signal.

13. The line driver circuit of claim 10, wherein:
the conductive line comprises a word line coupled to a plurality of memory cells.

14. The line driver circuit of claim 13, further including:
a global word line decoder that drives the second input signal node between at least two levels according to received address values.

15. A line driver circuit, comprising:
an integrated circuit substrate of a first conductivity type having at least a first well and a second well of a second conductivity type formed therein, the second well being coupled to a first power supply node;
a first transistor and a second transistor having source-drain paths connected in series between a select signal node and a second power supply node, the source-drain paths having a common connection to a word line, the word line coupled to a plurality of memory cells; the first transistor formed in the first well including a gate coupled to a line select signal node, the second transistor including a gate coupled to the line select signal node;
a third transistor formed in the second well having a source coupled to the first power supply node, a drain coupled to the first well, and a gate coupled to a mode signal node;
a fourth transistor having a source drain path coupled between the word line and the second power supply node, and a gate coupled to an inverse select signal node; wherein:
during an active mode of the line driver circuit, the word line is coupled to the select signal node by the first transistor and the third transistor couples the first well to the first power supply node, and
during a standby mode of the line driver circuit, the word line is coupled to the second power supply node by the fourth transistor and the mode transistor is turned off to allow the first well to electrically float thereby electrically isolating the first well to reduce gate induced drain leakage through the first well.

16. The line driver circuit of claim 15, wherein:
the substrate is a p-type substrate and the first and second wells are n-type wells; and
the first transistor and third transistor are p-channel insulated gate field effect transistors (IGFETs), and the second transistor is an n-channel IGFET.

* * * * *